United States Patent [19]

Carson et al.

[11] 4,354,107
[45] Oct. 12, 1982

[54] DETECTOR ARRAY MODULE-STRUCTURE AND FABRICATION

[75] Inventors: John C. Carson, Corona Del Mar; Paul F. Dahlgren, Newport Beach, both of Calif.

[73] Assignee: Irvine Sensors Corporation, Costa Mesa, Calif.

[21] Appl. No.: 206,994

[22] Filed: Nov. 14, 1980

Related U.S. Application Data

[62] Division of Ser. No. 855,242, Nov. 28, 1977, Pat. No. 4,304,624.

[51] Int. Cl.$^3$ ............................................. H01J 5/02
[52] U.S. Cl. .................................... 250/239; 250/578
[58] Field of Search ............... 250/211 R, 211 J, 578, 250/239, 209; 357/30, 31, 32

[56] References Cited

U.S. PATENT DOCUMENTS 3,668,408  6/1972  Yamashita et al. ................. 250/209
3,690,953  9/1972  Wise ...................................... 357/32
3,970,990  7/1976  Carson ................................ 250/578

Primary Examiner—David C. Nelms
Attorney, Agent, or Firm—Thomas J. Plante

[57] ABSTRACT

A photo-detector array module is disclosed wherein: (a) the focal plane array of photo-detectors is in electrical contact with thin film conductors supported on thin ceramic layers extending perpendicular to the focal plane, and (b) sub-module structures, each composed of such layers, have complementary shapes (such as "O-shaped" and "I-shaped") to provide "component wells" for electronics within the three dimensional space defined at one end by the two-dimensional area of the focal plane. In order to fabricate such a module satisfactorily, a method is disclosed in which each unimaged layer (i.e., layer whereon the thin film conductors have not yet been photodelineated) is individually laminated to the prior structure, and the photo-delineation process on the unimaged layer includes an optical alignment step to insure alignment of the thin film conductors on each layer with those on preceding layers.

5 Claims, 11 Drawing Figures

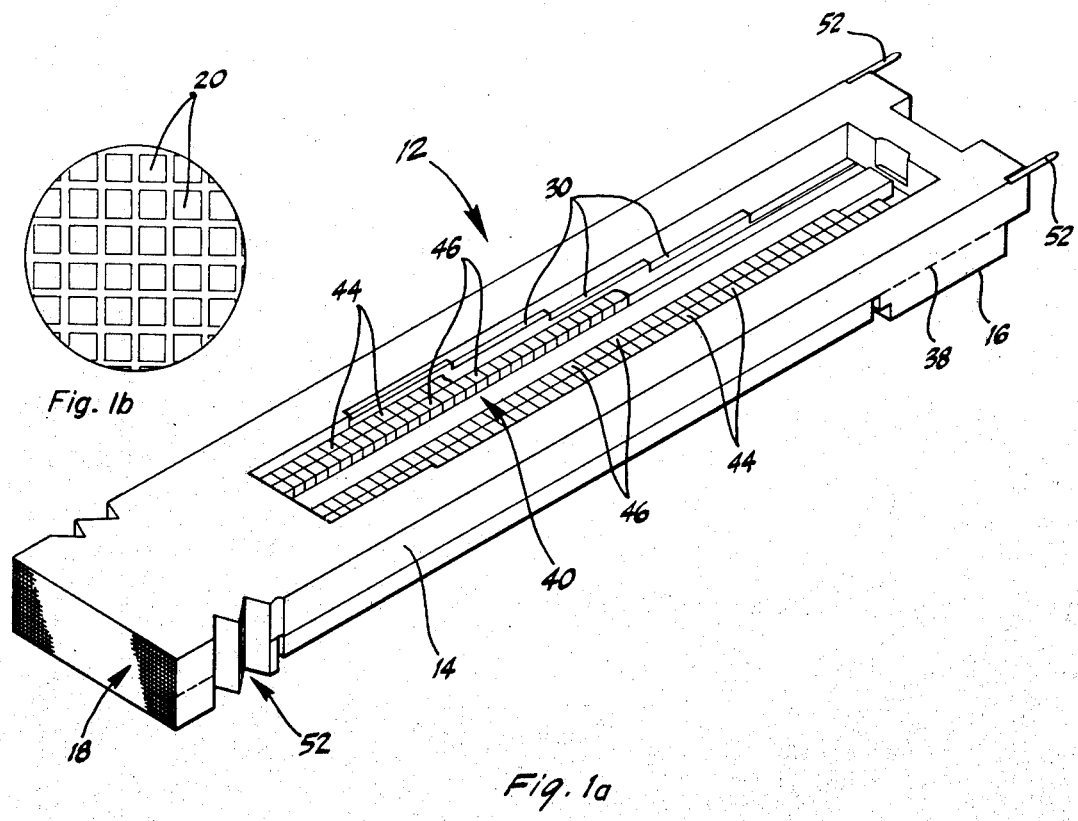
Fig. 1a
Fig. 1b
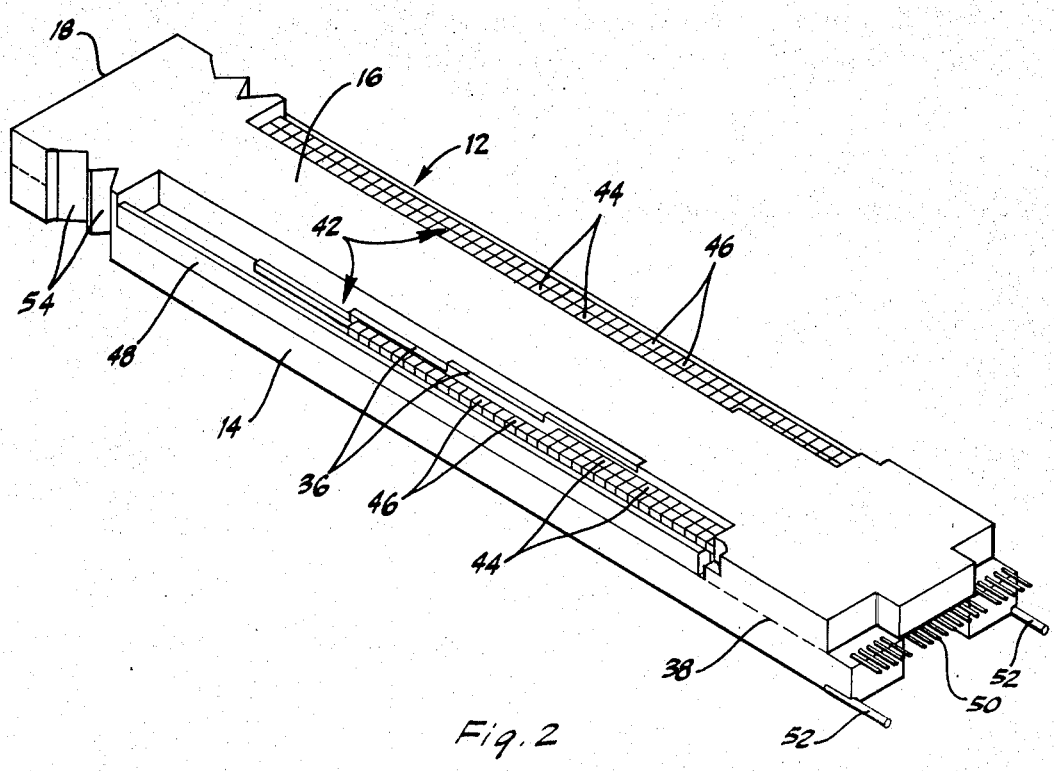
Fig. 2

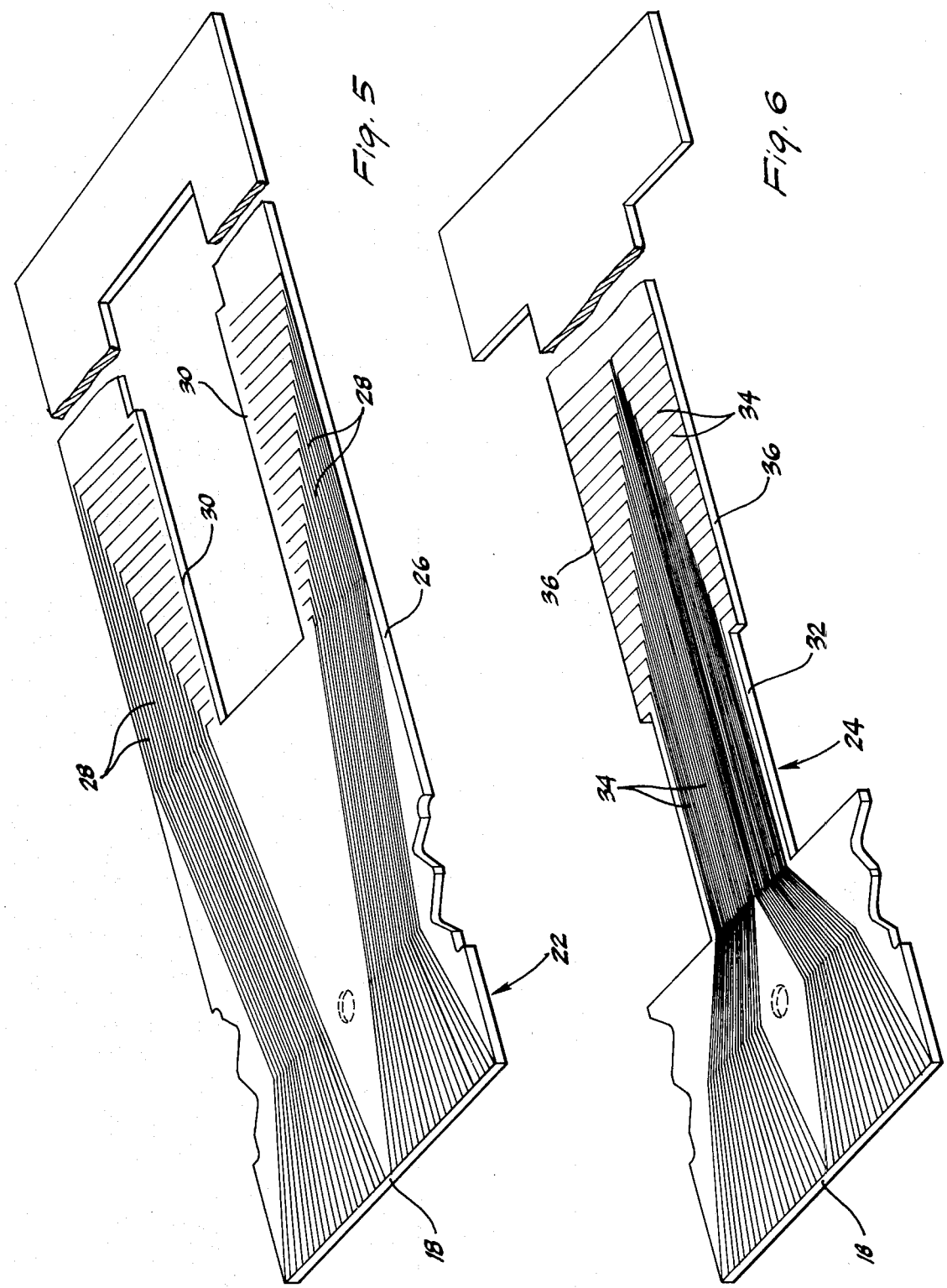

DETECTOR ARRAY MODULE-STRUCTURE AND FABRICATION

CROSS REFERENCE TO RELATED APPLICATION

This application is a division of application Ser. No. 855,242, filed Nov. 28, 1977, now U.S. Pat. No. 4,304,624.

BACKGROUND OF THE INVENTION

This invention relates to the field of electro-optical detecting apparatus which utilizes "mosaic" detector arrays to provide surveillance of an extensive scene. The mosaic detector arrays are large numbers of closely spaced individual photodetector elements (either photo-conductors or photo-diodes) arranged in essentially a two-dimensional, or planar, array.

An overall system incorporating such mosaic detector arrays is disclosed in U.S. Pat. Nos. 3,852,714 and 3,970,990, based on the inventions of John C. Carson, one of the joint applicants herein. Those patents provide a full explanation of the reasons for, and benefits of, such detector arrays and the adaptive imaging systems in which they are incorporated.

In FIGS. 6 and 16 of each of the Carson patents, specific mosaic detector array modules are disclosed. The present invention is concerned both with improving the structures of such detector array modules, and with providing a more practical method of fabricating such structures.

It is very important to provide a module wherein the electrical conductors and electronic chips associated with the detectors are housed in the "volume" of space created by extending the two-dimensional surface area of the detector array in a direction perpendicular to that two-dimensional surface. This permits large numbers of such modules to be located contiguously, so that a continuous detector-filled surface is provided. In other words, the dimension perpendicular to the plane of the detectors is used to package the conductor leads connected to the detectors, and also electronics associated with individual detectors or groups of detectors.

Another crucial consideration is the fabrication method used in constructing the modules. A problem encountered with the module structures and fabrication methods disclosed in the Carson patents is the difficulty of providing accurate alignment of the conductors which are located in separate layers of the module. The alignment requirements are extremely hard to satisfy because of the need to connect the conductors separately to the multiplicity of very closely spaced detector elements.

Another problem encountered is the current inadequacy of the state of the art relating to metallized holes, or vias, which were relied on as conductors in the modules disclosed in the Carson patents. Two module designs are shown in those patents, one in FIG. 6 and one in FIG. 16, both of which use vias as part of the electrical conductor pattern.

SUMMARY OF THE INVENTION

One aspect of the present invention is a novel method for forming multi-layered modules which combine a mosaic detector array in a package with thin film conductors and electronic chips. This novel method involves adding each layer separately to build up the module, and includes the step of optically aligning the conductors on each layer with those on the underlying layer. In the disclosed version of the invention, the conductor pattern of each supporting layer of non-conducting material is formed thereon after optically aligning such conductor pattern with the conductor pattern already applied to a previous layer. This insures proper location of the conductors for contact with their respective detectors, even though the supporting layers may be slightly mispositioned with respect to one another.

The conductors which lead from the respective detectors to the electronics located in the modules are all formed between the supporting layers of insulating material; and there is no need for electrical connections extending through holes in such layers.

The overall method contemplated involves the direct mounting of the detectors on the end of the module formed by the layered structure. There is no separate substrate layer between the detectors and the end of the layered structure.

The complete module construction preferably combines sub-module structures which have complementary shapes, so designed as to provide for "wells" in which electronic components can be located without projecting outside the area defined by the detector array. Preferably one of the sub-modules is generally "I-shaped" and the other is generally "O-shaped", although other combinations are feasible, such as "T-shaped" and "U-shaped." This combination of differently configured sub-modules provides flat, or platform, surfaces at the interface between the "I-shaped" layered structure and the "O-shaped" layered structure, which platform surfaces are needed for the placement of electronic components, and for terminals which provide connecting points to exterior circuitry.

BRIEF DESCRIPTION OF THE DRAWINGS

FIGS. 1a and 2 are views in perspective of a complete module, the two views being taken from opposite sides of the same module;

FIG. 1b is a close up of the detectors mounted on the focal plane of the module;

FIG. 5 is a partial view in perspective of a single "O-shaped" layer illustrating the placement of thin-film conductors thereon;

FIG. 6 is a partial view in perspective of a single "I-shaped" layer illustrating the placement of thin-film conductors thereon;

DETAILED DESCRIPTION OF PREFERRED EMBODIMENT

Figure 3:
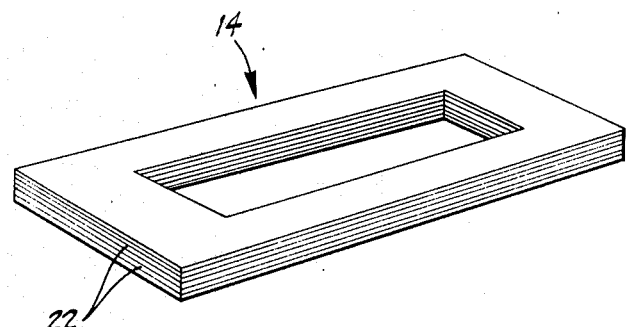
FIG. 3 is a perspective view showing the layered structure of a sub-module having a generally "O-shaped" configuration, which is one of two sub-modules used in the complete module of FIGS. 1 and 2.

FIGS. 1a and 2 show the opposite sides of a completed module, which is generally indicated at 12. This sub-module consists of two sub-modules which are differently configured, so that when they are placed together there will be "wells", or recesses, to receive electronic components which will not protrude from the sides of the module. Our preferred complementary sub-module shapes are a generally "O-shaped" sub-module 14, which is shown on top in FIG. 1a, and a generally "I-shaped" sub-module 16, which is shown on top in FIG. 2. It will be apparent, however, that cooperating sub-module shapes other than "I" and "O" can be substituted without departing from the basic concepts of this application. For example, one sub-module may be "U-shaped" and the other may be "T-shaped."

The photo-detector array is located on the end 18 of the module, as shown in FIG. 1a, and FIG. 1b is a "blown-up" view of the placement of several of the individual infrared photo-detector elements 20. These photo-detectors 20, which may be either photo-conductors or photo-diodes, are preferably on 4 mil centers, providing an extremely large number of detectors in a very small area, but also creating severe alignment problems for the thin-film conductors which travel to the interior of the module, and which must be individually in conducting relationship with separate detector elements.

The end 18 of the module which contains the individual photo-detector elements is located in the focal plane of the surveillance apparatus for which the module is designed. Because the entire module, and all the sub-components packaged within it, are confined to the volume of space created by perpendicularly extending the focal plane area of the module, any number of such modules may be mounted side-by-side to create an arbitrarily large continuous detector array. The module may be described as a "rectangular parallelepiped," since each of its surfaces is a rectangle.

Each of the sub-modules 14 and 16 is composed of a number of thin layers. This is best understood from FIGS. 3 and 4, which are intended to illustrate the multi-layered structures of the sub-modules, without showing details of their configuration.

Figure 4:
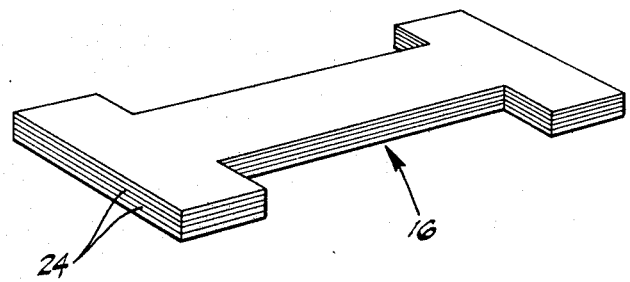
FIG. 4 is a perspective view showing the layered structure of a sub-module having a generally "I-shaped" configuration, which is the other of the two sub-modules used in the complete module of FIGS. 1a and 2.

In FIG. 3, there is shown an "O-shaped" sub-module 14 having 6 individual "O-shaped" thin layers 22; and in FIG. 4 there is shown an "I-shaped" sub-module 16 having 5 individual "I-shaped" thin layers 24. Each of the thin layers 22 and 24 constitutes a substrate layer formed by an insulating material which supports a layer of thin film conductors. The substrate layers 22 are glued together to form the "O-shaped" sub-module 14, and the substrate layers 24 are glued together to form the "I-shaped" sub-module 16. Thin film conductor patterns are located between the thin substrate layers.

The "O-shaped" and "I-shaped" sub-modules are glued together to form the complete module, which has component "wells" providing the necessary space for locating substantial numbers of electronic components within the available three-dimensional, or rectangular parallelepiped space.

In the preferred arrangement, the thin film conductors on each layer travel to the interior of the module, reappearing at bonding pads adjacent to hybrid bandpass filter (RC) chips. After being individually filtered, sets of 32 signal channels are multiplexed by parallel in, serial out CCD (charge coupled device) analog multiplexer chips, the outputs of which travel from the module by flex circuits attached at the end opposite the focal plane detector array.

FIGS. 5 and 6 show portions of the individual substrate layers. In FIG. 5, part of an individual "O-shaped" layer 22 is shown. A generally "O-shaped" ceramic insulating and supporting layer, or wafer, 26 carries a large number of thin film conductors 28 which follow photo-delineated circuit paths to two inwardly facing connection shelves, or ledges, 30 formed on opposite sides of the open center of the "O-shaped" layer. When the layer 22 is in the complete module, detector elements mounted on the focal plane face 18 of the layer are connected individually by the conductors 28 to the electronic components, which are located in the space provided in the center of the "O-shaped" layers 22, and which are connected to the conductors on ledges 30 by means of wire stitch bonds (not shown). The ledges 30 must be "staggered," i.e., the ledges for each successive layer 22 must be longitudinally beyond the ledges of the preceding layer, thereby necessitating the use of relatively long layer configurations.

In FIG. 6, part of an individual "I-shaped" layer 24 is shown. A generally "I-shaped" ceramic insulating and supporting layer, or wafer, 32 carries a large number of thin film conductors 34 which follow photo-delineated circuit paths to two outwardly facing connections shelves, or ledges, 36 formed on opposite sides of the stem of the "I-shaped" layer. When the layer 24 is in the complete module, detector elements mounted on the focal plane face 18 of the layer are connected individually by the conductors 34 to the electronic components, which are located in the spaces provided at opposite sides of the stem of the "I-shaped" layers 24, and which are connected to the conductors on ledges 36 by means of wire stitch bonds (not shown). The ledges 36 must be "staggered," i.e., the ledges for each successive layer 24 must be longitudinally beyond the ledges of the preceding layer.

Returning now to FIGS. 1a and 2, the structure of the complete module can be better understood. The lines between individual layers are not shown in these figures, but a dotted line 38 is used to show the location of the interface between the "I-shaped" sub-module and the "O-shaped " sub-module. (The two sub-modules are secured together by the same adhesive material used to glue individual layers to one another). The interface between the sub-modules provides the platform surfaces to support the electronic components, which are located in the wells, or recesses, provided at the center of the "O-shaped" sub-module and at the sides of the "I-shaped" sub-module. As seen in FIG. 1, the recess 40 in the center of the "O-shaped" sub-module provides room for electronic components, which are supported on the platform provided by the surface of the stem of the "I-shaped" sub-module. As seen in FIG. 2, two recesses 42 at opposite sides of the "I-shaped" sub-module provide room for electronic components, which are supported on the platform provided by the surface of the sides of the "O-shaped" sub-module. In other words, the detectors from the top layers of the module are processed by electronics mounted on the bottom layers of the module, and vice versa.

In FIGS. 1a and 2, the four rows of electronic components 44 which are located nearest the thin film conductors are RC chips functioning as hybrid bandpass filter chips. The four rows of electronic components 46 which are located next to the chips 44 are CCD chips functioning as parallel in, serial out analog multiplexer chips.

The output signals from the chips 46, as well as control signals and power forms, are connected by the means of wire stitch bonds (not shown) to a control bus pallet 48. A ground plane is deposited under the pallet 48 to isolate the control signals from the detector leads. An area at the end of the module remote from the focal plane is used to consolidate control and output leads before they are routed to external electronics via connector pins 50. The purpose of "control" signals is to use computer control logic to effect a second level of multiplexing.

Two small guide pins 52 provide support and indexing to rods (not shown) which also provide cooling. Alignment and cooling rod cutouts 54 may be provided near the focal plane to facilitate alignment and cooling in an integrated focal plane assembly.

The non-overlapping ledges, or shelves, 30 on successive "O-shaped" layers, previously explained in reference to FIG. 5, are shown in FIG. 1. The non-overlapping ledges, or shelves, 36 on successive "I-shaped" layers, previously explained in reference to FIG. 6, are shown in FIG. 2.

For stitch bonding purposes, the detector leads must be deposited on the top of each layer on the upper layers, and on the bottom of each layer on the lower layers. There is one exception to this. The top layer of the lower half has detector leads on both sides to provide leads in the detector lead plane between the two halves (line 38). The absence of this lead plane would result in a gap of one row in the detector mosaic. A very thin cap layer (not shown), which does not carry detector leads, may be used to support the edge detectors.

It is necessary to offset the electronics component well of the "O" sub-module one shelf length from the component wells of the "I" sub-module on the long axis of the module. The "I" layers allow clearance for electronics chips at the side and real estate for routing detector leads in the center. The "O" layers allow clearance for the electronics chips in the middle and real estate for routing detector leads on the sides. A conflict arises on the "O" layer next to the "I" sub-module because there are detector leads on both sides of that "O" layer. On one side real estate is required at the edges to route detector leads. On the other side real estate is required for routing detector leads in the center. Therefore, the middle of the "O" cannot begin until after the center detector leads are terminated. This increases the length of the "I" by about one inch because the middle of the "O" provides clearance for "I" electronics.

From the foregoing description, it will be apparent that a module has been provided, for use in mosaic detector array systems, which provides detector lead planes located solely (without via holes) between the layers of the module, and which permits the inclusion of very significant numbers of electronic components confined within the rectangular parallelepiped space defined at one end by the area of the focal plane detector array.

DETAILED DESCRIPTION OF METHOD OF FABRICATION

The first general step in the process, which step includes several sub-steps, is fabrication of the individual layers 26 and 32. The material which currently appears most practical is ceramic although developmental work is also under way relating to the future use of polymer substrate layers. The ceramic is procured in flat sheets, specified as to surface quality and flatness. It is usually procured in length suitable to provide wafers having a thickness of about 10 mils. It is then necessary to grind down the individual ceramic layers to the desired thinness, which in the current design is 4 mils. The area dimensions of each layer are usually either 2"×6" or 2"×10", so the grinding process requires very careful control. After grinding, the ceramic layers are profiled by sand blasting. Profiling is performed using a profiling template which is machined to have the correct tolerances for the finished layer. Two types of layers are created—"O" layers and "I" layers. All "O" layers and all "I" layers are similar but not quite the same in design. Profiled layers are inspected to check for conformance in thickness, thickness uniformity, geometrical dimensions and flatness.

The next general step is preparation for delineation of the thin film conductors, or leads, 28 or 34 on each layer. Each layer is first metallized using evaporation techniques. These are standard techniques used throughout the industry. However, the requirements of the substrate design require achieving the highest quality of coatings which is currently available. Metallization includes a thin chrome layer which is for adhesion, over which a layer of gold is evaporated. Thereafter all metallized layers are coated with photoresist in preparation for lead delineation. This is a standard process but it requires high uniformity in the thickness of the photoresist coating.

Next, a mask is aligned to the first ceramic layer in the sub-module, and the leads thereon are delineated by exposing to ultraviolet light. Standard imaging techniques are used, including the washing away of unexposed photoresist, and etching through the gold and chrome coatings. Because of the long leads and narrow spacings, very high control of the imaging and delineation process is required. After lead delineation on each layer, the leads are checked for continuity and for shorts between leads.

At this point, the next layer is glued on top of the previously image layer. For this purpose, special alignment and lamination fixtures are preferable. While standard industry practices are used for the lamination, the alignment tolerances make this procedure difficult. In the case of modules using lead sulfide detectors, a bias plane goes between successive signal planes. In the lamination step for such modules, a previously imaged bias plane is laminated to the signal plane below, and then another unimaged signal plane is laminated on top. In the case of modules requiring single ended detectors, each layer is a signal plane, and the gluing step is only performed once at this point of the procedure.

The next step involves precise alignment of the photo-delineated leads on the layer which has just been glued to the preceding layer. Before photo-delineation, the layer should be photoresisted again to insure that any scratches that have occurred during the lamination (gluing) process do not affect the imaging process.

The alignment of the thin film conductors on the top layer to those on the preceding layer is accomplished optically during the photo-delineation step. This is best understood by referring to FIGS. 7-10.

Figure 7:
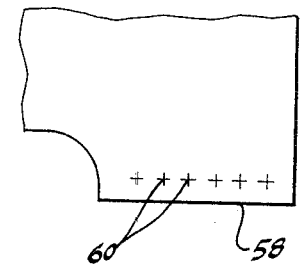
FIGS. 7 and 8 are plan views of small portions of two successive individual layers showing alignment marks on layer tabs which are used in aligning the conductor pattern on each layer with the conductor pattern on the layer below.
Figure 8:
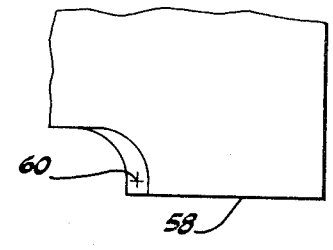
Figure 9:
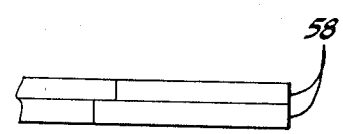
FIG. 9 is a side elevation of FIG. 8.

Alignment is accomplished by using a series of tabs included in the individual layer outlines, which tabs are ground off after module fabrication is complete. A typical tab 58 is shown in FIG. 7. A series of alignment marks 60 are printed on the tab during the photo-lithographic printing process. The next layer, which has previously been metallized and coated with photoresist, is glued on top of the existing layer. The tab on this layer is staggered so as to expose one alignment mark 60 on the underlying layer, as shown in FIGS. 8 and 9. The mask is then aligned over the coated layer using the alignment mark visible from the layer below. In this way, alignment from layer to layer is assured despite the fact that the coated layer may be slightly mispositioned.

Figure 10:
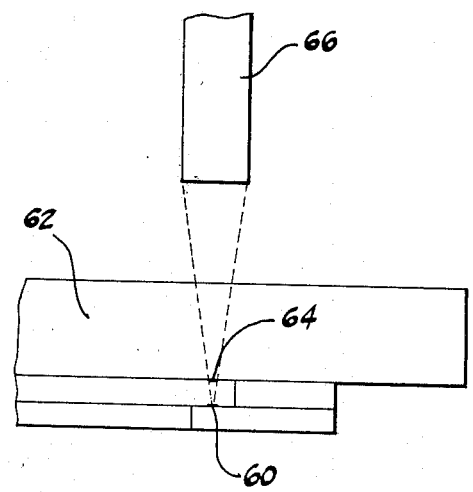
FIG. 10 is a side elevation showing the alignment mechanism which is used to insure proper alignment of the layers shown in FIGS. 6–9.

As shown in FIG. 10, during the alignment step a photo-lithography mask 62 contacts the coated layer which is ready for photo-delineation of its thin film conductor pattern. An alignment mark 64 is provided on the mask 62. An alignment microscope 66 is used to optically align the alignment mark 64 on the mask with the alignment mark 60 on the underlying layer. The position of the mask is adjustable for alignment purposes, and a plurality of reference marks on each layer may be used to insure accuracy. Thus, the delineation process involves accurately referencing a contact mask to reference features for each layer and exposure of the photoresist.

The lead delineation steps are now repeated. The masked photoresist is developed by ultraviolet light, the undeveloped photoresist is washed away, and the exposed metal is etched away.

The steps are repeated for each layer added to the sub-module. The next layer is glued on, and then the thin film conductor pattern on that layer is formed by the photo-delineation process, during which optical alignment is used to insure accurate placement of the conductor pattern with respect to prior layers.

After the desired number of layers have been added to form separately the "I-shaped" sub-module 16 and the "O-shaped" sub-module 14, the completed "I" and "O" structures are ground off at the focal plane end to expose the lead pattern. Then the "I" structure is aligned with the "O" structure, and the two are laminated together to form the complete module structure (to which the photo-detectors have not yet been added). A final grinding step is used to bring the module to the final geometrical dimensions.

The next step is detector integration, i.e., the photo-detectors 20 are emplaced on the focal plane end of the module, in contact with the thin film conductors formed between the thin module layers. The detector integration steps depend on the type of detector used. In the case of lead sulfide or lead selenide, these detectors are chemically deposited on the end of the board. In the case of backside-illuminated photovoltaic detectors built in chip form (indium arsenide antimonide and lead in tin telluride) the detectors are mated to the substrate through flip chip bonding techniques. In the case of mercury cadmium telluride, the detectors are integrated by a proprietary process of the assignee of this application, which is the subject matter of Rotolante and Koehler application Ser. No. 15,070, filed Feb. 26, 1979.

Finally, the electronic chips 44 and 46 are bonded to the platforms provided by sub-module interface 38, using conventional die attach techniques. These chips are then interconnected electrically using wire bonding techniques. At this point the module is completed. It will subsequently be incorporated in a focal plane detector mosaic assembly, and electrically connected to external electronics.

The manufacturing steps outlined above have for the first time provided a fully practical approach to fabrication of mosaic detector array modules. The detection systems incorporating such modules constitute a highly significant and useful technology, but a technology which has proved very difficult to implement because of new and very challenging problems created primarily by space limitations.

The following claims are intended not only to cover the specific embodiments disclosed, but also to cover the inventive concepts explained herein with the maximum breadth and comprehensiveness permitted by the prior art.

What is claimed is:

1. A photo-detector mosaic array module one end of which provides a detector-element mosaic area located on the focal plane of the detector array, which module comprises:
   a first sub-module comprising a plurality of thin layers extending perpendicular to the focal plane and secured together, with detector-connected lead circuitry between such layers;
   said first sub-module having open space within the cubic space defined at one end by the focal plane area, thereby providing a component well for electronic components within such cubic space;
   a second sub-module comprising a plurality of thin layers extending perpendicular to the focal plane and secured together, with detector-connected lead circuitry between such layers;
   said second sub-module having open space within the cubic space defined at one end by the focal plane area, thereby providing a component well for the electronic components within such cubic space;
   said first and second sub-modules being secured together to form the module;
   a first set of electrical components located within the component well provided in the first sub-module; and
   a second set of electronic components located within the component well provided in the second sub-module.

2. The photo-detector array module of claim 1 wherein the first set of electronic components is supported on the second sub-module, and the second set of electronic components is supported on the first sub-module.

3. The photo-detector array module of claim 1 or claim 2 wherein:
   thin film electrical conductors are located between the layers of the first sub-module to connect the first set of electronic components to photo-detector elements in the focal plane; and
   thin film electrical conductors are located between the layers of the second sub-module to connect the second set of electronic components to photo-detector elements in the focal plane.

4. A photo-detector mosaic array module having a cubic-shaped configuration provided with a focal plane surface at one end thereof and adapted to fit against other modules to form a continuous focal plane assembly, which module comprises:
   a plurality of thin substrate layers extending at right angles to the focal plane surface and secured together so that their contiguous edges constitute the focal plane surface, the arrangement being such that no portion of the substrate layers projects outside the rectangular parallelepiped space defined at one end by the focal plane area of the module;

a multiplicity of thin film electrical leads on each of the substrate layers which terminate at electrical contact points on the focal plane surface of the module; and a multiplicity of individual photo-detector elements mounted on the focal plane surface, each in individual electrical contact with one of the electrical contact points thereon.

5. The photo-detector array module of claim 4 which also comprises:

electronic components mounted on one or more of the substrate layers and located within space provided by cutout spaces in contiguous substrate layers, thereby confining such electronic components within the rectangular parallelepiped configuration.

* * * * *